(12) United States Patent
Thareja et al.

(10) Patent No.: US 11,152,479 B2
(45) Date of Patent: Oct. 19, 2021

(54) SEMICONDUCTOR DEVICE, METHOD OF MAKING A SEMICONDUCTOR DEVICE, AND PROCESSING SYSTEM

(71) Applicant: Applied Materials, Inc., Santa Clara, CA (US)

(72) Inventors: Gaurav Thareja, Santa Clara, CA (US); Xuebin Li, Sunnyvale, CA (US); Abhishek Dube, Fremont, CA (US); Yi-Chiau Huang, Fremont, CA (US); Andy Lo, Saratoga, CA (US); Patricia M. Liu, Saratoga, CA (US); Sanjay Natarajan, Portland, OR (US); Saurabh Chopra, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 9 days.

(21) Appl. No.: 16/773,848

(22) Filed: Jan. 27, 2020

(65) Prior Publication Data

US 2020/0258997 A1 Aug. 13, 2020

Related U.S. Application Data

(60) Provisional application No. 62/803,374, filed on Feb. 8, 2019.

(51) Int. Cl.
*H01L 29/45* (2006.01)
*H01L 29/08* (2006.01)
(Continued)

(52) U.S. Cl.
CPC ........ *H01L 29/456* (2013.01); *H01L 29/0847* (2013.01); *H01L 29/401* (2013.01); *H01L 29/41791* (2013.01); *H01L 29/785* (2013.01)

(58) Field of Classification Search
CPC ................ H01L 29/41791; H01L 29/0847
See application file for complete search history.

(56) References Cited

U.S. PATENT DOCUMENTS 5,976,976 A 11/1999 Doan et al.
6,130,145 A 10/2000 Ilg et al.
(Continued)

FOREIGN PATENT DOCUMENTS

KR 20160101517 A 8/2016

OTHER PUBLICATIONS

International Search Report and the Written Opinion of the International Searching Authority for PCT/US2020/015202 dated May 20, 2020, 10 pages.

*Primary Examiner* — Farun Lu
(74) *Attorney, Agent, or Firm* — Patterson + Sheridan LLP (57) ABSTRACT

The present disclosure generally relates to methods for forming a semiconductor device, a semiconductor device, and a processing chamber. The method includes forming a source/drain region in a processing system, forming a doped semiconductor layer on the source/drain region in the processing system, forming a metal silicide layer, forming a dielectric material, forming a trench in the dielectric material, and filling the trench with a conductor. The source/drain region, the doped semiconductor layer, and the metal silicide layer are formed without breaking vacuum. A semiconductor device includes a plurality of layers, and the semiconductor device has reduced contact resistance. A processing system is configured to perform the method and form the semiconductor device. Embodiments of the present disclosure enable formation of a source/drain contact with reduced contact resistance by using integrated processes, which allows vari- (Continued)

ous operations of the source/drain contact formation to be performed within the same processing system.

11 Claims, 6 Drawing Sheets

(51) Int. Cl.
   *H01L 29/40*     (2006.01)
   *H01L 29/78*     (2006.01)
   *H01L 29/417*    (2006.01)

(56) References Cited

U.S. PATENT DOCUMENTS

| | | | |
|---|---|---|---|
| 7,732,269 B2 | 6/2010 | Kim et al. | |
| 7,960,236 B2 | 6/2011 | Chopra et al. | |
| 9,059,024 B2 | 6/2015 | Glass et al. | |
| 9,768,013 B2 | 9/2017 | Dube et al. | |
| 9,853,129 B2 | 12/2017 | Bauer et al. | |
| 9,893,189 B2 | 2/2018 | Colinge et al. | |
| 2010/0276761 A1* | 11/2010 | Tung | H01L 29/7839 |
| | | | 257/384 |
| 2014/0001520 A1 | 1/2014 | Glass et al. | |
| 2014/0008812 A1 | 1/2014 | Emesh | |
| 2014/0065819 A1 | 3/2014 | Ahmed et al. | |
| 2015/0044842 A1 | 2/2015 | Wang et al. | |
| 2015/0079751 A1 | 3/2015 | Alptekin et al. | |
| 2016/0029301 A1 | 1/2016 | Park et al. | |
| 2016/0329431 A1 | 11/2016 | Glass et al. | |
| 2017/0352762 A1 | 12/2017 | Yang et al. | |
| 2017/0365480 A1* | 12/2017 | Swenberg | H01L 21/76843 |
| 2018/0145140 A1 | 5/2018 | Lin et al. | |
| 2018/0166575 A1 | 6/2018 | Colinge et al. | |
| 2018/0174913 A1* | 6/2018 | More | H01L 21/823418 |
| 2018/0233505 A1 | 8/2018 | Mulfinger et al. | |
| 2019/0067013 A1* | 2/2019 | Wang | H01L 21/76895 |

\* cited by examiner

SEMICONDUCTOR DEVICE, METHOD OF MAKING A SEMICONDUCTOR DEVICE, AND PROCESSING SYSTEM

CROSS-REFERENCE TO RELATED APPLICATIONS

This application claims priority to U.S. Provisional Patent Application No. 62/803,374, filed Feb. 8, 2019, which is hereby incorporated by reference in its entirety.

BACKGROUND

Field

Embodiments of the present disclosure generally relate to an apparatus and a method and, more specifically, to a semiconductor device, a method of making a semiconductor device, and a processing system.

Description of the Related Art

Transistors are fundamental device elements of modern digital processors and memory devices, and have found applications in high-power electronics. Currently, there are a variety of semiconductor device (e.g., transistor) designs or types that may be used for different applications. Various transistor types include, for example, field-effect transistors (FET), bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (FinFET).

A FinFET can be fabricated on a bulk semiconductor substrate, e.g., a silicon substrate, and comprises a fin-like structure that runs in a length direction along a surface of the substrate and extends in a height direction normal to the substrate surface. The fin has a narrow width (e.g., less than 250 nanometers). The fin can pass through an insulating layer. A gate structure comprising a conductive gate material and gate insulator can be formed over a region of the fin. Upper portions of the fin are doped on either side of the gate structure to form source/drain regions adjacent to the gate.

FinFETs have favorable electrostatic properties for complimentary MOSFET scaling to smaller sizes. Because the fin is a three-dimensional structure, the transistor's channel can be formed on three surfaces of the fin, so that the FinFET can exhibit a high current switching capability for a given surface area occupied on the substrate. Since the channel and device can be raised from the substrate surface, there can be reduced electric field coupling between adjacent devices as compared to conventional planer MOSFETs.

A key challenge in semiconductor design, manufacture, and operation is contact resistance. For example, the source and drain regions of a FinFET device may be eroded by the etch process for forming the source/drain contact trench, leading to increased contact resistance. A result of increased contact resistance is decreased performance of circuit devices, including transistors and other device structures formed on a semiconductor substrate.

Therefore, there is a need for improved semiconductor processing methods for forming a semiconductor device having decreased contact resistance.

SUMMARY

Embodiments of the present disclosure generally relate to a semiconductor device, a method of making a semiconductor device, and a processing system. The method results in a semiconductor device having decreased contact resistance. The method can be performed in the processing system.

In one embodiment, a method for forming a semiconductor device is provided. The method includes forming a source/drain region in a substrate, forming a doped semiconductor layer on the source/drain region, forming a metal silicide layer on the doped semiconductor layer in the processing system, forming a dielectric material over the metal silicide layer, forming a trench in the dielectric material to expose a portion of the metal silicide layer, and filling the trench with a conductor. The source/drain region, the doped semiconductor layer, and the metal silicide layer are formed without breaking vacuum.

In another embodiment, a semiconductor device is provided. The semiconductor device includes a source/drain region extending from a semiconductor structure, a doped semiconductor layer disposed on and wrapping around the source/drain region, a metal silicide layer disposed on the doped semiconductor layer and wrapping around the source/drain region, and a conductor disposed on the metal silicide layer.

In yet another embodiment, a processing system is provided. The processing system includes a transfer chamber, a plurality of process chambers coupled to the transfer chamber, and a controller. The controller is configured to cause a process to be performed in the processing system that includes forming a source/drain region, forming a doped semiconductor layer on the source/drain region, and forming a metal silicide layer on the doped semiconductor layer. The source/drain region, the doped semiconductor layer, and the metal silicide layer are formed without breaking vacuum.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only exemplary embodiments and are therefore not to be considered limiting of its scope, and can admit to other equally effective embodiments.

To facilitate understanding, identical reference numerals have been used, where possible, to designate identical elements that are common to the figures. It is contemplated that elements and features of one embodiment can be beneficially incorporated in other embodiments without further recitation.

DETAILED DESCRIPTION

Embodiments described herein include a method of forming a semiconductor device, a semiconductor device, and a processing system. The method includes forming a source/drain region, forming a doped semiconductor layer, forming a metal silicide layer on the doped semiconductor layer, forming a dielectric material, forming a trench in the dielectric material, and filling the trench with a conductor. The source/drain region, the doped semiconductor layer, and the metal silicide layer are formed without breaking vacuum. A semiconductor device can be formed from the method. The semiconductor device includes a plurality of layers, and the semiconductor device has reduced contact resistance. A processing system is configured to perform the method and form the semiconductor device. The doped semiconductor layer has a higher dopant concentration than that of the source/drain region, and higher dopant concentration leads to decreased contact resistance. Embodiments disclosed herein can be useful for, but are not limited to, semiconductor devices with reduced contact resistance.

The foregoing broadly outlines techniques described in this disclosure. It is contemplated that the concepts of the present disclosure can be implemented for a planar transistor device or for a three-dimensional transistor device, such as fin field effect transistors (FinFETs), horizontal gate all around (HGAA) FETs, vertical gate all around (VGAA) FETs, nanowire channel FETs, strained-semiconductor devices, etc.

As used herein, the term "about" refers to a +/−10% variation from the nominal value. It is to be understood that such a variation can be included in any value provided herein.

Figure 1:
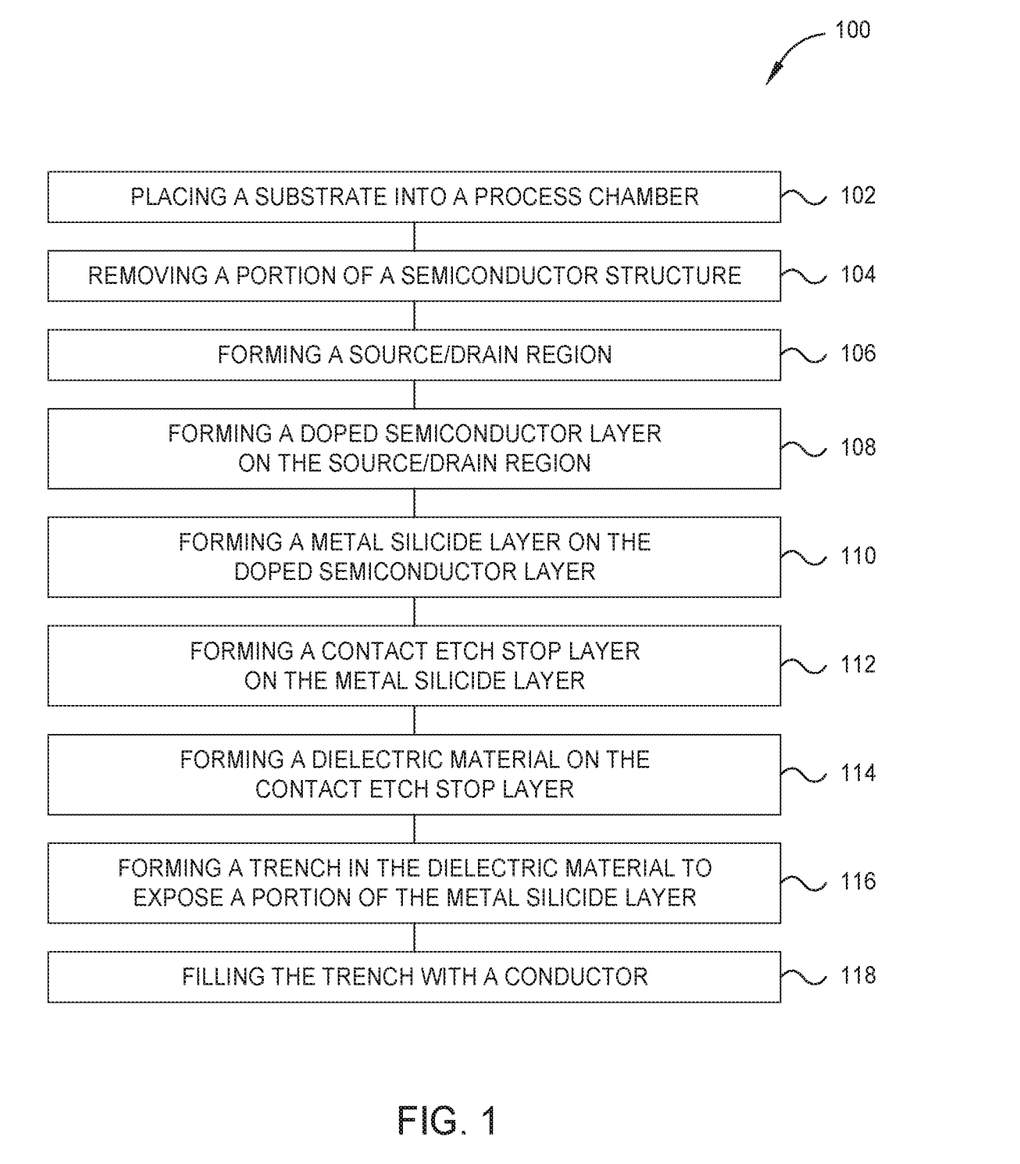
FIG. 1 is a flow diagram of method operations for forming a semiconductor device, according to one embodiment.

FIG. 1 is a flow diagram of method 100 operations for forming a semiconductor device, according to one embodiment. FIGS. 2A-2H illustrate a cross-sectional view of a substrate 200, according to one embodiment. Although the method 100 operations are described in conjunction with FIGS. 1 and 2A-2D, persons skilled in the art will understand that any system configured to perform the method operations, in any order, falls within the scope of the embodiments described herein. It is noted that the method 100 can be utilized to form any other semiconductor structures not presented herein. Those skilled in the art should recognize that a full process for forming a semiconductor device and the associated structures are not illustrated in the drawings or described herein.

Figure 2A:
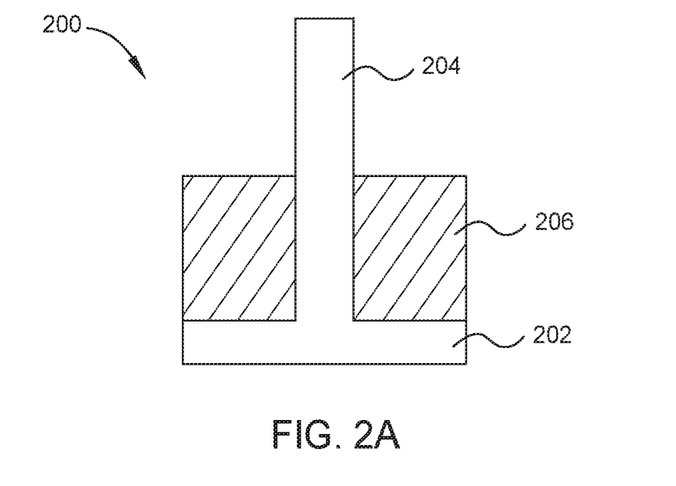
FIGS. 2A-2H illustrate cross-sectional views of a substrate, according to one embodiment.

The method 100 begins at operation 102 by placing a substrate 200 into a process chamber. In one example, the process chamber is an etch chamber. As illustrated in FIG. 2A, the substrate 200 includes a semiconductor layer 202, at least one semiconductor structure 204 extending from the semiconductor layer 202, and a dielectric material 206 disposed between the adjacent semiconductor structures 204 on the semiconductor layer 202. The semiconductor structure 204 can be semiconductor fins. The semiconductor layer 202 can be fabricated from silicon, germanium, silicon germanium, group III/V compound semiconductors, gallium arsenide (GaAs) and/or indium gallium arsenide (InGaAs), or other semiconductor materials. The semiconductor layer 202 can be doped with a p-type or an n-type dopant. For example, the semiconductor layer 202 is doped with a p-type dopant, such as boron (B), or doped with an n-type dopant, such as phosphorus (P) and/or arsenic (As). The semiconductor structure 204 can be fabricated from the same material as the semiconductor layer 202. The semiconductor structure 204 can be integrated with the semiconductor layer 202. The dielectric material 206 can include shallow trench isolation (STI) regions, and can be fabricated from silicon dioxide ($SiO_2$), silicon nitride ($Si_3N_4$), silicon carbonitride (SiCN), mixtures thereof, or any other suitable dielectric material.

Figure 2B:
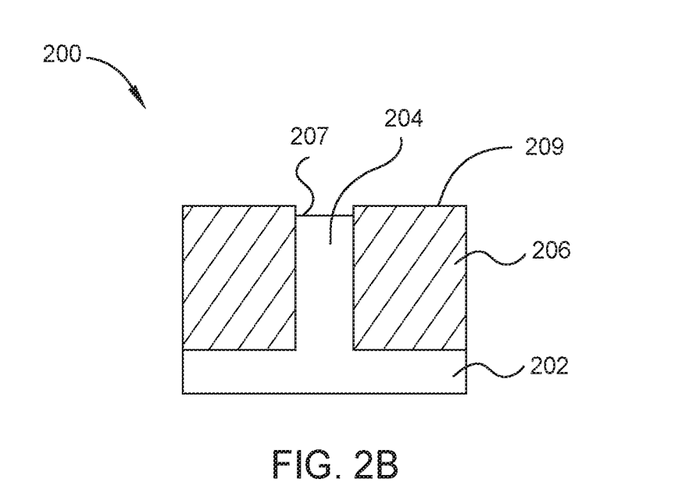

At operation 104, a portion of at least one semiconductor structure 204 is removed to expose a surface 207 of the remaining portion of the semiconductor structure 204. The surface 207 of the semiconductor structure 204 can be recessed from surfaces 209 of the dielectric material 206, as illustrated in FIG. 2B. In other embodiments, the surface 207 is coplanar with the surfaces 209 of the dielectric material 206. The removal of the portion of the semiconductor structure 204 can be by an etch process that is performed in the etch chamber.

Figure 2C:
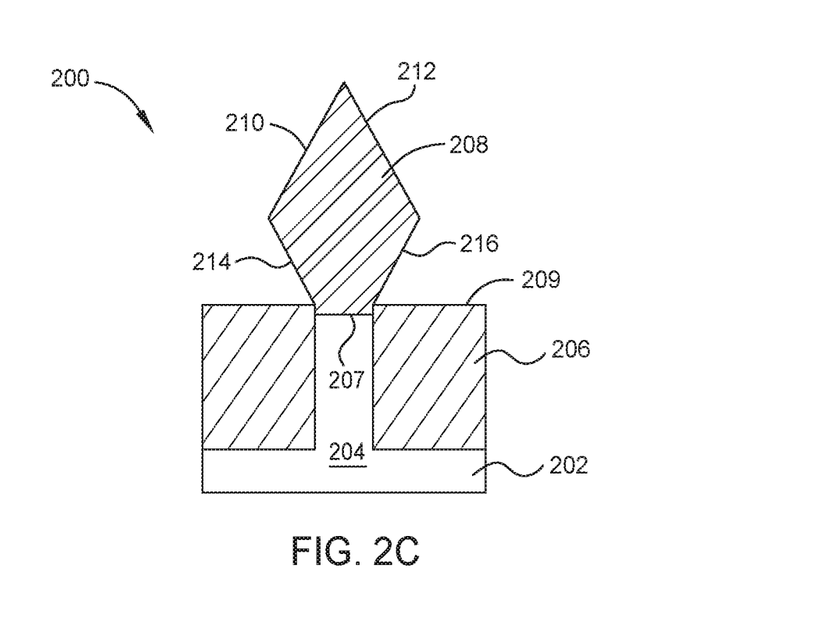

At operation 106, a source/drain region 208 is formed on the surface 207 of the semiconductor structure 204. The source/drain region 208 can be a source region or a drain region, as illustrated in FIG. 2C. The source/drain region 208 can include a merged source and drain region 208. In either example, the source/drain region 208 is fabricated from a semiconductor material that is grown epitaxially on the surface 207 of the semiconductor structure 204. The source/drain region 208 can be formed in an epitaxial deposition chamber of the processing system. The substrate 200 can include a plurality of gates (not shown) disposed across the source/drain regions 208.

In one embodiment, which can include or be combined with one or more embodiments described herein, the source/drain region 208 is fabricated from silicon, germanium, silicon-germanium, or group III/V compound semiconductors, such as gallium arsenide (GaAs) and/or indium gallium arsenide (InGaAs), or any other suitable semiconductor. The source/drain region 208 can be doped with a p-type or an n-type dopant. In one example, the source/drain region 208 is doped with a p-type dopant, such as B. Alternatively, the source/drain region 208 is be doped with an n-type dopant, such as P and/or As. The source/drain region 208 can be fabricated from a metal silicide, such as titanium silicide, tungsten silicide, molybdenum silicide, ruthenium silicide, cobalt silicide, or any combination of the above.

The metallic silicide source/drain region 208 has a reduced resistance compared to the semiconductor source/drain region 208. The source/drain region 208 is selectively grown epitaxially on the surface 207 of the semiconductor structure 204, and because of the different growth rate on different surface planes, facets 210, 212, 214, 216 can be formed such that the source/drain region 208 has a diamond shape, as illustrated in FIG. 2C.

A pre-clean process can be performed on the surface 207 of the semiconductor structure 204 prior to forming the source/drain region 208. The pre-clean process is performed to remove contaminants, such as carbon or oxide contaminants, on the surface 207 of the semiconductor structure 204. The pre-clean process can include any suitable etch process, such as dry etch, wet etch, or a combination thereof. The pre-clean process can be isotropic or directional. In one example, the pre-clean process is performed in a process chamber using a remote plasma source. One example process chamber suitable for performing the pre-clean process is an AKTIV Pre-Clean™ chamber or a SICONI® clean chamber available from Applied Materials, Inc., Santa Clara, Calif. Alternatively, the pre-clean process is performed in an etch chamber, such as an etch chamber using an inductively coupled plasma (ICP) source. One example etch chamber can be a modified Decoupled Plasma Nitridation (DPN) chamber that is available from Applied Materials Inc., Santa Clara, Calif. However, it is contemplated that other suitably configured chambers from other manufacturers can also be implemented to perform the pre-clean process.

Figure 2D:
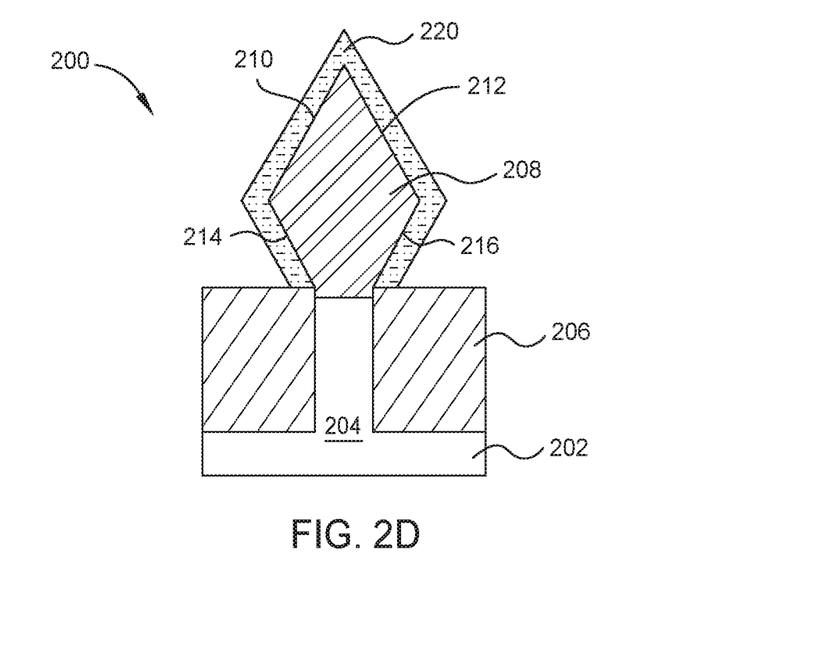

At operation 108, a doped semiconductor layer 220 is formed on the source/drain region 208 in the processing system, as illustrated in FIG. 2D. The doped semiconductor layer 220 can be formed by a selective epitaxial deposition process. The doped semiconductor layer 220 is formed in the same processing system as the source/drain region 208. In one example, the doped semiconductor layer 220 is formed in the same epitaxial deposition chamber as the source/drain region 208. In another example, the doped semiconductor layer 220 is formed in a different epitaxial deposition chamber of the processing system. Because the source/drain region 208 and the doped semiconductor layer 220 are formed in the same processing system, there is no vacuum break between the processes (e.g., operations 106 and 108). Thus, a pre-clean process is not necessary between the processes.

The doped semiconductor layer 220 is formed on the facets 210, 212, 214, 216 but not on the dielectric material 206. Because the doped semiconductor layer 220 is formed by an epitaxial deposition process, the doped semiconductor layer 220 conformally covers the facets 210, 212, 214, 216 of the source/drain region 208. In other words, the conformal doped semiconductor layer 220 wraps around the source/drain region 208. The selective epitaxial deposition process can be performed while the substrate is maintained at a temperature of less than about 450° C. The doped semiconductor layer 220 can be fabricated from the same material as the source/drain region 208, with the exception that the dopant concentration in the doped semiconductor layer 220 is substantially higher than the dopant concentration in the source/drain region 208. For example, the doped semiconductor layer 220 can be fabricated from germanium-tin (GeSn) doped with B and/or gallium (Ga), silicon-germanium (SiGe) doped with B, germanium (Ge) doped with B and/or Ga, or silicon doped with P and/or As. In one example, the doped semiconductor layer 220 includes a first layer and a second layer, and the first layer is a silicon layer doped with As and the second layer is a silicon layer doped with P.

The doped semiconductor layer 220 is formed by a dopant soak process, according to one embodiment. During the dopant soak process, an outer portion of the source/drain region 208, such as from each facet 210, 212, 214, 216 to a predetermined depth, is converted to the doped semiconductor layer 220. For example, the facets 210, 212, 214, 216 of the source/drain region 208 are exposed to one or more gases containing one or more dopants, such as Ga, B, P, and/or As during the dopant soak process. The doped semiconductor layer 220 can have a thickness ranging from about 1 Å to about 10 nm. The dopant concentration in the source/drain region 208 is less than the dopant concentration in the doped semiconductor layer 220. Increased dopant concentration in the doped semiconductor layer 220 decreases contact resistance.

The doped semiconductor layer 220 can be formed in a reduced pressure (RP) Epi chamber available from Applied Materials, Inc., Santa Clara, Calif. However, it is contemplated that other suitably configured chambers from other manufacturers can also be implemented to perform the selective epitaxial deposition or the dopant soak process to form the doped semiconductor layer 220.

Figure 2E:
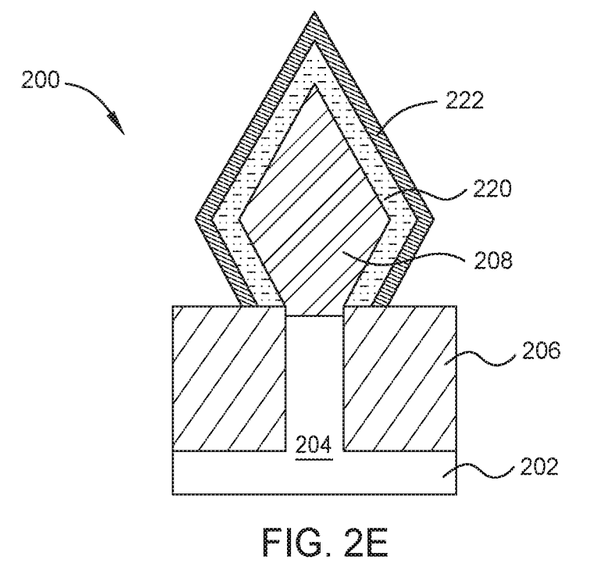

At operation 110, a metal silicide layer 222 is formed on the doped semiconductor layer 220 in the processing system, as illustrated in FIG. 2E. In one example, the metal silicide layer 222 is formed by a chemical vapor deposition (CVD) process. In another example, the metal silicide layer 222 is formed by an epitaxial deposition process. For example, the metal silicide layer 222 is formed on the doped semiconductor layer 220 but not on the dielectric material 206 as a result of the selective epitaxial deposition process. Because the metal silicide layer 222 is formed by an epitaxial deposition process, the metal silicide layer 222 conformally covers the facets 210, 212, 214, 216 of the source/drain region 208. In other words, the conformal metal silicide layer 222 wraps around the source/drain region 208.

The metal silicide layer 222 can include titanium silicide, cobalt silicide, ruthenium silicide, tungsten silicide, molybdenum silicide, any combination of the above, or other suitable metal silicides. In one example, the metal silicide layer 222 is formed in the same process chamber as the doped semiconductor layer 220. In another example, the metal silicide layer 222 is formed in a different process chamber, such as an epitaxial deposition chamber, of the processing system. Because the doped semiconductor layer 220 and the metal silicide layer 222 are formed in the same processing system, there is no vacuum break between the processes (e.g., operations 108 and 110). A pre-clean process is not necessary between the processes.

An optional cap layer can be formed on the metal silicide layer 222. The cap layer can include a dielectric. The cap layer can be fabricated from a nitride or an oxide material, such as titanium nitride, silicon nitride, aluminum oxide, hafnium oxide, zirconium oxide, manganese oxide, or any combination of the above. In some embodiments, the cap layer is formed by nitridating the metal silicide layer 222, and the cap layer is a metal silicon nitride layer. The nitridation process can include exposing the metal silicide layer 222 to a nitrogen-containing plasma or a nitrogen-containing ambient environment so that nitrogen atoms chemically react with atoms residing at the exposed surface of the metal silicide layer 222 to form a surface nitride layer (e.g., the cap layer). The nitridation process can be performed in a plasma chamber using a plasma source, such as an inductively coupled plasma (ICP) source, capacitively coupled plasma (CCP) source, or a combination thereof. The nitridation process can be performed in the modified Decoupled Plasma Nitridation (DPN) chamber available from Applied Materials, Inc., Santa Clara, Calif., or other suitable chamber.

Figure 2F:
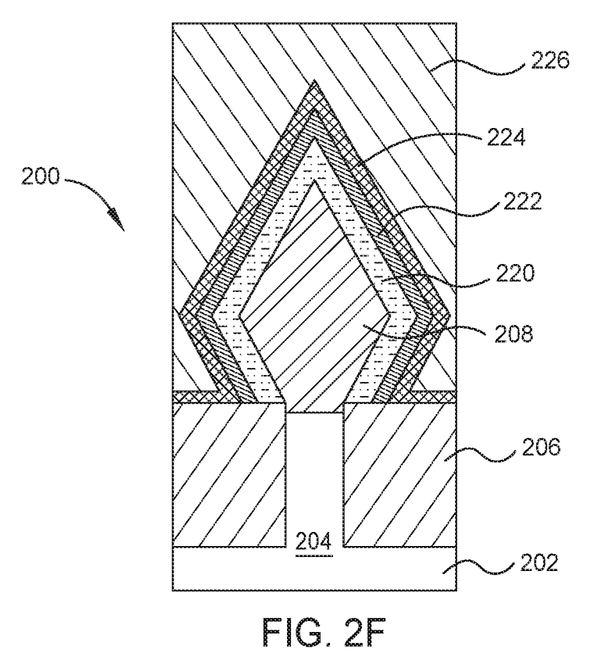

At operation 112, a contact etch stop layer (CESL) 224 is formed on the dielectric material 206 and the metal silicide layer 222, as illustrated in FIG. 2F. The CESL 224 is, for example, fabricated from a dielectric material, such as silicon nitride, silicon oxynitride, silicon carbon nitride, or a combination thereof.

At operation 114, a dielectric material 226 is formed on the CESL 224, as illustrated in FIG. 2F. The dielectric material 226 can be an interlayer dielectric, and can be fabricated from a dielectric material, such as silicon oxide, silicon nitride, silicon oxynitride, silicon carbide, or a combination thereof.

Figure 2G:
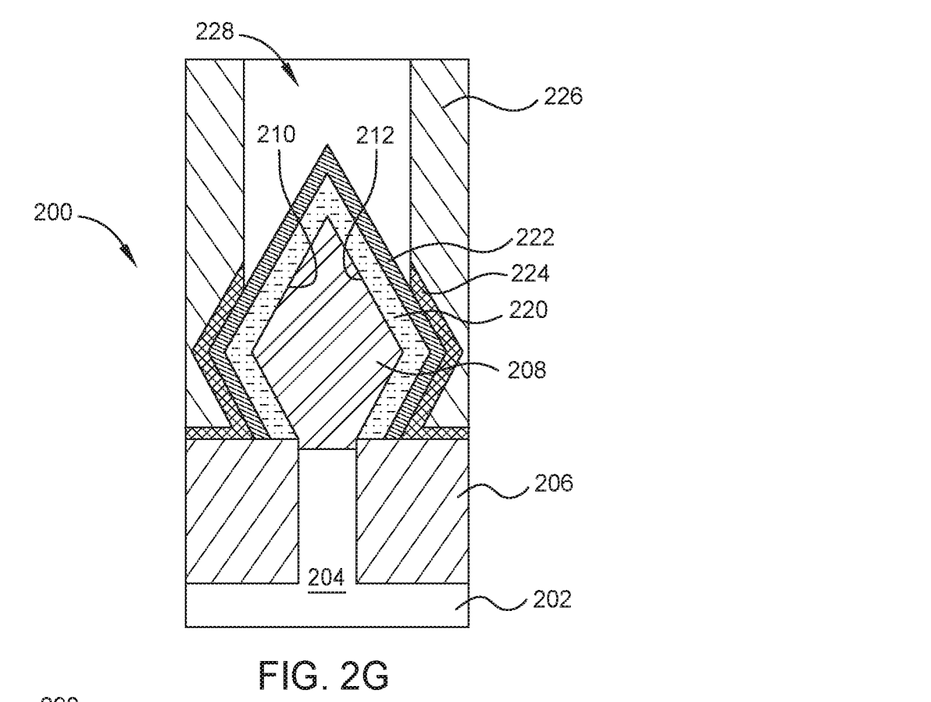

At operation 116, a trench 228 is formed in the dielectric material 226 to expose a portion of the metal silicide layer 222 disposed over facets 210, 212, as illustrated in FIG. 2G. The trench 228 is formed by removing a portion of the dielectric material 226 and the CESL 224 disposed over facets 210, 212 of the source/drain region 208, and a portion of the metal silicide layer 222 is exposed. The trench 228 can be formed by any suitable removal process. In one example, the trench 228 is formed by a reactive ion etching (RIE) process. The trench 228 can be formed in an RIE chamber or other suitable etch chamber.

Figure 2H:
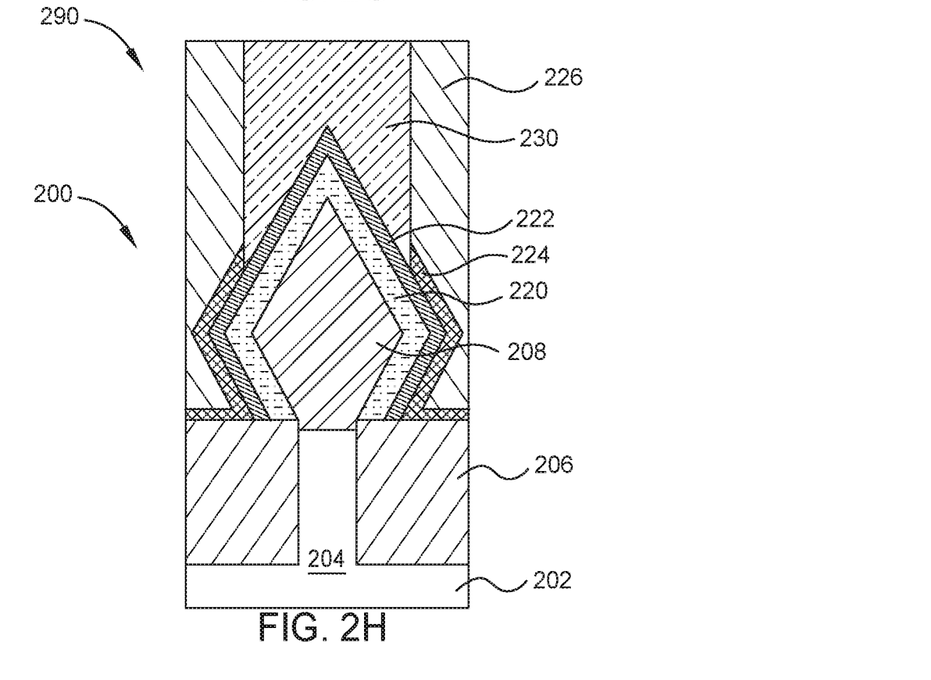

At operation 118, a conductor 230 is formed in the trench 228 to fill the trench 228, as illustrated in FIG. 2H. The conductor 230 is fabricated from an electrically conductive material, such as a metal. In one example, the conductor 230 includes cobalt. The conductor 230 can be formed by one or more deposition processes. For example, the conductor 230 is formed by first forming a seed layer and then a bulk fill on the seed layer. The seed layer and the bulk fill are fabricated from the same material. The conductor 230 can be formed by any suitable deposition method, such as chemical vapor deposition (CVD) or physical vapor deposition (PVD). Thus, the method 100 results in formation of a semiconductor device 290.

Operations 106, 108, and 110 are performed to reduce contact resistance of a source/drain contact in a transistor. In some embodiments, one or more operations of the operations 108 and 110 can be omitted while still achieving the reduced contact resistance.

In one embodiment, which can include or be combined with one or more embodiments described herein, operation 106 is performed, followed by operation 112, without performing operations 108 and 110. For example, after the metal silicide source/drain region 208 is formed, the CESL 224 is formed on the source/drain region 208, and the doped semiconductor layer 220 and the metal silicide layer 222 are not formed between the source/drain region 208 and the CESL 224.

Figure 3:
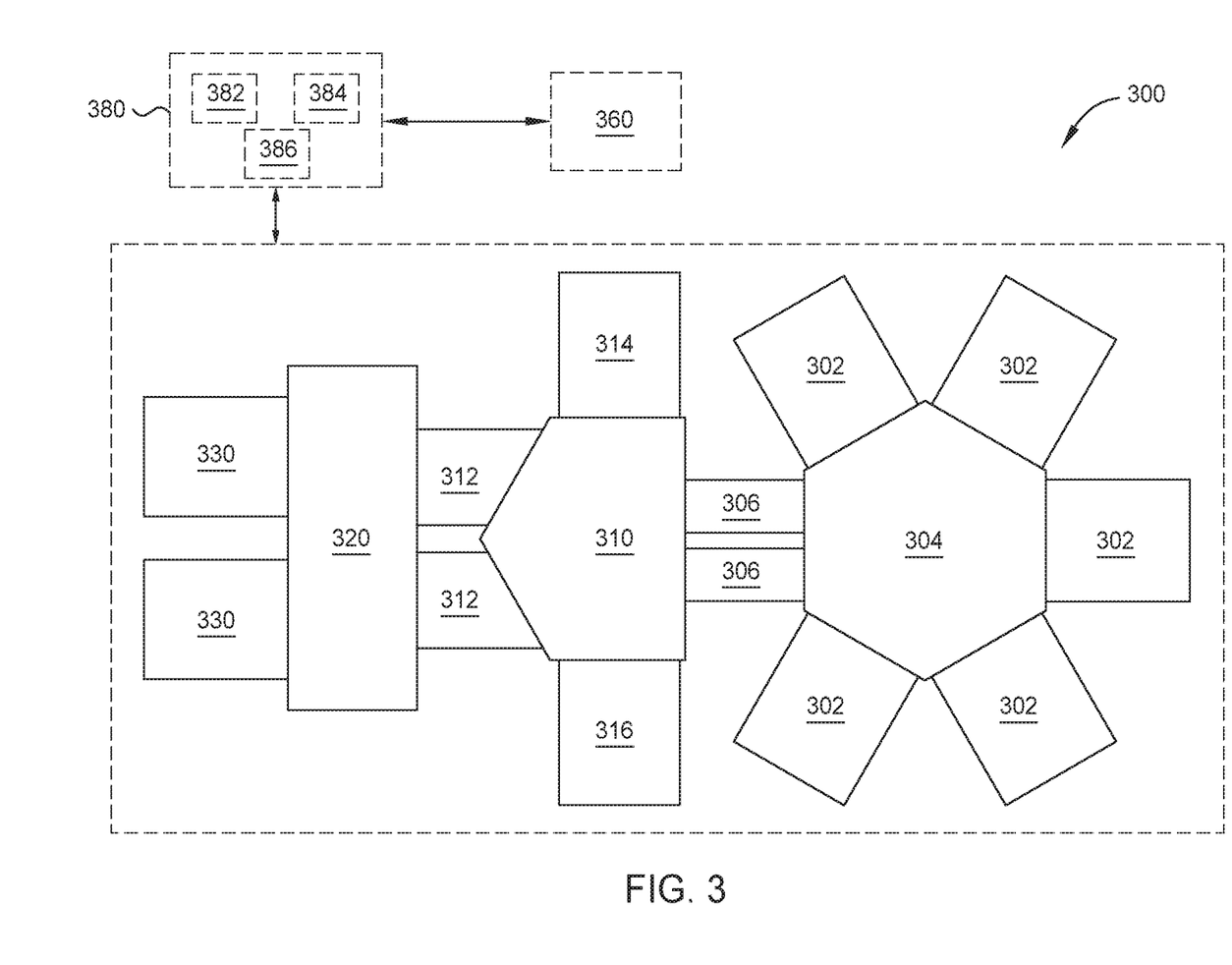
FIG. 3 illustrates a schematic top view of a processing system, according to one embodiment.

FIG. 3 illustrates a schematic top-view diagram of a processing system 300, according to one embodiment. The processing system 300 is configured to perform the method 100. Examples of a processing system that can be suitably modified in accordance with the teachings provided herein include the ENDURA®, PRODUCER® or CENTURA® integrated processing systems or other suitable processing systems commercially available from Applied Materials, Inc., located in Santa Clara, Calif. It is contemplated that other processing systems (including those from other manufacturers) can be adapted to benefit from aspects described herein.

As shown, the processing system 300 includes a plurality of process chambers 302, 314, 316, a first transfer chamber 304, pass-through chambers 306, a second transfer chamber 310, a factory interface (FI) 320, pods 330, and a system controller 380. The plurality of process chambers 302 are coupled to the first transfer chamber 304. The first transfer chamber 304 is also coupled to the first pair of pass-through chambers 306. The first transfer chamber 304 has a centrally disposed transfer robot (not shown) for transferring substrates between the pass-through chambers 306 and the process chambers 302. The pass-through chambers 306 are coupled to the second transfer chamber 310, which is coupled to the process chamber 314 that is configured to perform a pre-clean process and the process chamber 316 that is configured to perform a selective epitaxial deposition process (operations 106, 108, 110). The second transfer chamber 310 has a centrally disposed transfer robot (not shown) for transferring substrates between a set of load lock chamber 312 and the process chamber 314 or the process chamber 316. The factory interface 320 is connected to the second transfer chamber 310 by the load lock chambers 312. The factory interface 320 is coupled to the one or more pods 330 on the opposite side of the load lock chambers 312. The pods 330 typically are front opening unified pods (FOUP) that are accessible from a clean room.

During operation, a substrate is first transferred to the process chamber 314 where a pre-clean process is performed to remove contaminant, such as carbon or oxide contaminant from exposed surface of a semiconductor structure. Then the substrate is transferred to the process chamber 316 where operations 106, 108 and 110 are performed. In some embodiments, the process chamber 314 and/or process chamber 316 can be switched with any of the one or more process chambers 302. In some embodiments, operations 106, 108, 110 are performed in different process chambers 302. For example, operation 106 is performed in a first process chamber 302, operation 108 is performed in a second process chamber 302, and operation 110 is performed in a third process chamber 302.

The substrate is then transferred to one or more process chambers 302 in which the operations 112 to operations 118 are performed. Because all of the operations 106, 108, 110, 112, 114, 116, 118 are performed within the same processing system 300, vacuum is not broken as the substrate is transferred to various chambers, which decreases the chance of contamination and improves the quality of the deposited epitaxial film.

The system controller 380 is coupled to the processing system 300 for controlling the processing system 300 or components thereof. For example, the system controller 380 controls the operations of the processing system 300 using a direct control of the chambers 302, 304, 306, 310, 312, 314, 316, factory interface 320, and pods 330 of the processing system 300. In another example, the system controller 380 controls individual controllers associated with the chambers 302, 304, 306, 310, 312, 314, 316, factory interface 320, and pods 330. In operation, the system controller 380 enables data collection and feedback from the respective chambers to coordinate performance of the processing system 300.

The system controller 380 generally includes a central processing unit (CPU) 382, memory 384, and support circuits 386. The CPU 382 can be one of any form of a general purpose processor that can be used in an industrial setting. The memory 384, non-transitory computer-readable medium, or machine-readable storage device, is accessible by the CPU 382 and can be one or more of memory such as random access memory (RAM), read only memory (ROM), floppy disk, hard disk, or any other form of digital storage, local or remote. The support circuits 386 are coupled to the CPU 382 and can comprise cache, clock circuits, input/output subsystems, power supplies, and the like. The system controller 380 is configured to perform method 100 stored in the memory 384. The various embodiments disclosed in this disclosure can generally be implemented under the control of the CPU 382 by executing computer instruction code stored in the memory 384 (or in memory of a particular process chamber) as, e.g., a computer program product or software routine. That is, the computer program product is tangibly embodied on the memory 384 (or non-transitory computer-readable medium or machine-readable storage device). When the computer instruction code is executed by the CPU 382, the CPU 382 controls the chambers to perform operations in accordance with the various embodiments.

As described above, a method includes forming a source/drain region in a processing system, forming a doped semiconductor layer on the source/drain region in the processing system, forming a metal silicide layer on the doped semiconductor layer in the processing system, forming a dielectric material over the metal silicide layer, forming a trench in the dielectric material to expose a portion of the metal silicide layer, and filling the trench with a conductor. The source/drain region, the doped semiconductor layer, and the metal silicide layer are formed without breaking vacuum. A semiconductor device includes a plurality of layers, and the semiconductor device has reduced contact resistance. A processing system is configured to perform the method and form the semiconductor device.

Embodiments of the present disclosure enable formation of a source/drain contact with reduced contact resistance by using integrated processes, which allows various operations of the source/drain contact formation to be performed within the same processing system. In some embodiments, after the formation of the source/drain region, a doped semiconductor layer is formed on the source/drain region. The doped semiconductor layer has a higher dopant concentration than that of the source/drain region, and higher dopant concentration leads to decreased contact resistance.

While the foregoing is directed to embodiments of the present disclosure, other and further embodiments of the disclosure can be devised without departing from the basic scope thereof, and the scope thereof is determined by the claims that follow.

What is claimed is:

1. A method for forming a semiconductor device, the method comprising:
   forming a source/drain region on a substrate;
   forming a doped semiconductor layer on the source/drain region;
   forming a metal silicide layer on the doped semiconductor layer in a processing system, wherein the source/drain region, the doped semiconductor layer, and the metal silicide layer are formed without breaking vacuum;
   forming a dielectric material over the metal silicide layer;
   forming a trench in the dielectric material to expose a portion of the metal silicide layer; and
   filling the trench with a conductor.

2. The method of claim 1, wherein the method is performed in a single processing system.

3. The method of claim 1, further comprising performing a pre-clean process prior to forming the source/drain region.

4. The method of claim 1, wherein the doped semiconductor layer wraps around the source/drain region.

5. The method of claim 1, wherein the metal silicide layer wraps around the source/drain region.

6. The method of claim 1, further comprising forming a contact etch stop layer over the metal silicide layer, wherein the dielectric material is formed on the contact etch stop layer.

7. A processing system comprising:
   a transfer chamber;
   a plurality of process chambers coupled to the transfer chamber; and
   a controller configured to cause a process to be performed in the processing system that includes:
      forming a source/drain region;
      forming a doped semiconductor layer on the source/drain region; and
      forming a metal silicide layer on the doped semiconductor layer, wherein the source/drain region, the doped semiconductor layer, and the metal silicide layer are formed without breaking vacuum.

8. The processing system of claim 7, wherein the process further comprises forming a dielectric material over the metal silicide layer, forming a trench in the dielectric material to expose a portion of the metal silicide layer, and filling the trench with a conductor.

9. The processing system of claim 8, wherein the process further comprises forming a cap layer on the metal silicide layer, wherein the cap layer comprises a dielectric material.

10. The processing system of claim 8, wherein the process further comprises forming a contact etch stop layer over the metal silicide layer, wherein the dielectric material is formed on the contact etch stop layer.

11. The processing system of claim 7, further comprising a pre-clean chamber.

* * * * *